(12) United States Patent
McKay et al.

(10) Patent No.: US 9,938,139 B2
(45) Date of Patent: Apr. 10, 2018

(54) NONPARALLEL ISLAND ETCHING

(71) Applicant: Hewlett-Packard Development Company, L.P., Houston, TX (US)

(72) Inventors: Roger A. McKay, Corvallis, OR (US); Patrick W. Sadik, Corvallis, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 15/033,015

(22) PCT Filed: Oct. 30, 2013

(86) PCT No.: PCT/US2013/067600
§ 371 (c)(1),
(2) Date: Apr. 28, 2016

(87) PCT Pub. No.: WO2015/065395
PCT Pub. Date: May 7, 2015

(65) Prior Publication Data
US 2016/0244885 A1 Aug. 25, 2016

(51) Int. Cl.
| | |
|---|---|
| *B81C 1/00* | (2006.01) |
| *H01M 4/38* | (2006.01) |
| *H01M 4/04* | (2006.01) |
| *C23C 14/58* | (2006.01) |
| *C23F 1/16* | (2006.01) |
| *C23F 1/02* | (2006.01) |

(52) U.S. Cl.
CPC ...... *B81C 1/00539* (2013.01); *B81C 1/00119* (2013.01); *C23C 14/5873* (2013.01); *C23F 1/16* (2013.01); *H01M 4/0492* (2013.01); *H01M 4/386* (2013.01); *B81B 2201/058* (2013.01); *B81C 2201/014* (2013.01); *B81C 2201/0115* (2013.01); *C23F 1/02* (2013.01)

(58) Field of Classification Search
None
See application file for complete search history.

(56) References Cited

U.S. PATENT DOCUMENTS

| | | |
|---|---|---|
| 3,615,953 A | 10/1971 | Hill |
| 6,762,134 B2 | 7/2004 | Bohn et al. |
| 7,135,414 B2 | 11/2006 | Matsumura et al. |
| 7,704,809 B2 | 4/2010 | Yeo et al. |

(Continued)

FOREIGN PATENT DOCUMENTS

| | | |
|---|---|---|
| CN | 101083225 | 12/2007 |
| CN | 101131547 | 2/2008 |

(Continued)

OTHER PUBLICATIONS

PCT International Preliminary Report on Patentability for PCT/US2013067600, dated May 3, 2016.*

(Continued)

*Primary Examiner* — Jiong-Ping Lu
(74) *Attorney, Agent, or Firm* — Rathe Lindenbaum LLP (57) ABSTRACT

Etching islands are formed on a first face of a substrate and a second face of the substrate non-parallel to the first face. The first face and the second face of the substrate are concurrently exposed to a solution that reacts with the etching islands to concurrently form porous regions extending into the first face and the second face.

18 Claims, 4 Drawing Sheets

(56) References Cited

U.S. PATENT DOCUMENTS

| | | | |
|---|---|---|---|
| 2005/0106318 A1 | 5/2005 | Partridge et al. | |
| 2008/0090074 A1 | 4/2008 | Matsumura et al. | |
| 2010/0248449 A1 | 9/2010 | Hildreth et al. | |
| 2010/0303674 A1 | 12/2010 | Sutherland et al. | |
| 2011/0116029 A1 | 5/2011 | Funahashi et al. | |
| 2011/0136288 A1 | 6/2011 | Duane et al. | |
| 2011/0266521 A1 | 11/2011 | Ferrari et al. | |
| 2011/0316145 A1 | 12/2011 | Tsao et al. | |
| 2012/0168713 A1 | 7/2012 | Lee et al. | |
| 2013/0102107 A1 | 4/2013 | Hirose et al. | |
| 2014/0248539 A1* | 9/2014 | Liu | H01M 4/1395 429/218.1 |

FOREIGN PATENT DOCUMENTS

| | | |
|---|---|---|
| GB | 2495405 A | 4/2013 |
| JP | 2004165781 | 6/2004 |
| JP | 4049329 | 12/2007 |
| JP | 2010-248449 | 11/2010 |
| JP | 2013-150978 | 8/2013 |
| WO | WO-2006/051727 | 5/2006 |
| WO | WO-2010102306 | 9/2010 |
| WO | WO-2013050785 | 4/2013 |
| WO | WO-2013093504 | 6/2013 |
| WO | WO-2013/140177 | 9/2013 |

OTHER PUBLICATIONS

Y. Xiu et al., Nano Letters, vol. 7, pp. 3388-3393, year 2007.*

Dejarld, et al. "Formation of High Aspect Ratio GaAs Nanostructures with Metal-Assisted Chemical Etching", Jan. 1, 2013, Etchinghttp://www.electrochemsci.org/papers/vol8/80101163.pdf.

Huang, et al. "Oxidation Rate Effect on the Direction of Metal-Assisted Chemical and Electrochemical Etching of Silicon," J. Phys. Chem. C, 2010, 114 (24), pp. 10683-10690.

International Search Report and Written Opinion dated Jul. 7, 2014, PCT Patent Application No. PCT/US2013/067595 dated Oct. 30, 2013, Korean Intellectual Property Office.

International Search Report and Written Opinion dated Jul. 8, 2014, PCT Patent Application No. PCT/US2013/067600 dated Oct. 30, 2013, Korean Intellectual Property Office.

Li, et al., "Metal Assisted Chemical Etching in HF/H2O2 Two Produces Porous Silicon," Appl. Phys. Lett. 77, 2572 (2000).

Li, Zhaochen et al. "Macroporous Silicon Formation on Low-resistivity p-type c-Si Substrate by Metal-catalyzed Electrochemical Etching" International Journal of Electrochemical Science; Jan. 1, 2013; vol. 8; pp. 1163-1169.

Milazzo, et al., "Ag-Assisted Chemical Etching of (100) and (111) n-Type Silicon Substrates by Varying the Amount of Deposited Metal," Journal of The Electrochemical Society, 159 (9) D521-D525 (2012).

Morita, et al. "Simultaneous Flattening of Si(110), (111), and (001) Surfaces for Three-Dimensional Si Nanowires," Applied Physics Letters 100, 261605 (2012).

Tu, Yucliang et al. "Bi/In as Patterning and Masking Layers for Alkaline-based Si Anisotropic Etching", Micromachining and Microfabrication Process Technology VIII; Jan. 7, 2003; vol. 4979; pp. 87-98.

Huang, Zhipeng, et al. "Metalassisted chemical etching of silicon: a review." Advanced materials 23.2 (2011): 285-308.

Korotcenkov, G., and B. K. Cho. "Silicon porositication: state of the art." Critical Reviews in Solid State and Materials Sciences 35.3 (2010): 153-260.

* cited by examiner

NONPARALLEL ISLAND ETCHING

CROSS-REFERENCE TO RELATED APPLICATION

This application is a U.S. National Stage Application of and claims priority to International Patent Application No. PCT/US2013/067600, filed on Oct. 30, 2013, and entitled "NONPARALLEL ISLAND ETCHING," which is hereby incorporated by reference in its entirety.

BACKGROUND

Various material removal techniques are currently employed to form trenches, cavities and other structures in micro-electromechanical (MEMs) and other devices. Existing material removal techniques may be slow, costly and difficult to control.

DETAILED DESCRIPTION OF THE EXAMPLE EMBODIMENTS

Figure 1:
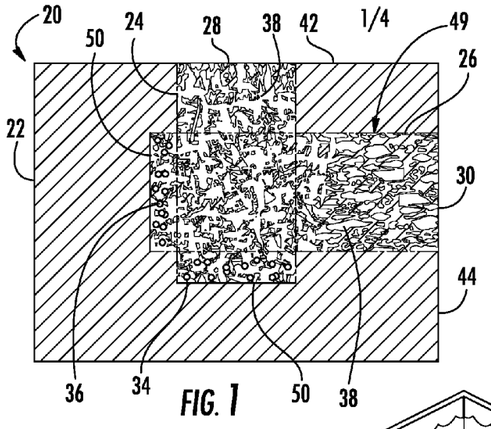
FIG. 1 is a sectional view of an example filter.

FIG. 1 is a sectional view illustrating an example filter 20. As will be described hereafter, filter 20 is well-suited to serve as a small-scale filter mechanism. Filter 20 comprises substrate 22, filter passages 24, 26 and metal etching islands 34, 36.

Substrate 22 comprises a layer or block of material that has properties so as to react with metal islands 34, 36 such that metal etching islands 34, 36 etch into substrate 22 when substrate 22, having metal etching islands 34, 36 deposited thereon, is exposed to a solution. In one implementation, substrate 22 has properties so as to react with metal islands 34, 36 configured for metal-assisted chemical etching. In one implementation, substrate 22 comprises silicon, poly-silicon, silicon germanium, a nitride, and oxide, a polymer, a ceramic, a metal, a group III-V material (from the periodic table of elements) or a combination thereof.

Although illustrated as a block, substrate 22 may comprise a layer or any other structure. Substrate 22 may comprise a structure for use in a micro-electromechanical (MEMs) device, a print head or other devices. Although substrate 22 is illustrated as a single block or layer, substrate 22 may comprise one or more layers or blocks positioned or joined to one another. For example, substrate 22 may comprise multiple substrates bonded to one another, wherein the multiple substrates may have the same or different crystal orientations.

Filter passages 24, 26 comprise porous passages extending into substrate 22 from non-parallel faces or surfaces 42, 44 of substrate, respectively. Filter passages 24, 26 filter fluids such as liquids and gases and may provide two+phase flow filtration. In the example illustrated, filter passages 24, 26 extend into substrate 22 from surfaces 42, 44 which are perpendicular to one another. In other implementations, surfaces 42, 44 may be oblique with respect to one another.

In the example illustrated, filter passages 24, 26 intersect one another so as to form a continuous bending or turning filter path 49 having an inlet 28 on surface 42 and an outlet 30 on surface 44. As a result, filter 20 not only filters fluid flow but also redirects the direction of fluid flow. In some implementations, because passage 49 bends or turns within substrate 22, portions of filter path 49 have a centerline extending in a first direction or first dimension of substrate 22 while other portions of passage 29 have centerline extending in a second direction or second dimension of substrate 22. As a result, filter path 49 may have a longer overall length as compared to a filtering facet simply extends from one side to another opposite side of substrate 22. Because filter path 49 has a longer overall length, filter path 49 may provide greater filtering in a more compact space conserving manner.

In the example illustrated, filter passages 24, 26 are each blind, terminating at a closed end portion 50 within substrate 22, wherein the close and portion 50 of substrate 22 forms a cap at the linear end of each of passages 24, 26. Although illustrated as extending past and across one another, in other implementations, filter passage 24, 26 may each terminate within or at an interior side of the other of filter passages 24, 26. In such implementations, because filter path 24, 26 terminate within substrate 22, rather than extending completely through substrate 22, substrate 22 offers greater structural integrity and stability about the overall filter path 49. In yet other implementations, one or both of filter passages 24, 26 may alternatively extend completely through substrate 22. In some implementations, the open ends of such filter passages 24, 26 may be sealed, capped or otherwise occluded, directing all fluid flow entering input 28 through outlet 30.

Each of filter passages 24, 26 comprises interconnected pores 38, such pores 38 being etched as a result of a reaction between metal islands 34, 36 with a solution to which metal islands 34, 36 and substrate 22 are exposed. In one implementation, filter passages 34, 36 and pores 38 have a size, diameter or maximum dimension or of between 10 nm and 1000 nm and nominally 100 nm. As a result, filtering passages 24, 26 well-suited for small-scale filtering mechanisms such as utilized in MEMs devices. In other implementations, filter passage 34, 36 and pores 38 may have other filtering properties.

Metal islands 34, 36 comprise etching islands or pockets of metal within and along filter passages 24, 26. Metal islands 34, 36 are composed of metals or other materials having property so as to react with substrate 22 and to etch substrate 22 when exposed to a metal assisted etching solution. In one implementation, metal islands 34, 36 comprises a metal catalyst or other metal that reacts within a solution of hydrofluoric acid and hydrogen peroxide to etch substrate 22. Examples of metals that may be used include, not limited to, silver, platinum, ruthenium, platinum, palladium, molybdenum, chromium, copper, tantalum, titanium, gold, Iridium, and mixtures or alloys thereof.

Metal islands 34, 36 are sized and spaced within substrate 22 based upon the properties of metal islands 34, 36, their reaction rate with the solution during the formation of filter 20 and the size and distribution of metal islands 34, 36 upon an external surface of substrate 22 prior to the metal islands 34, 36 being exposed to the solution. In one implementation, metal islands 34, 36 within substrate 22 that have not merged with other metal islands 34, 36 have a size/diameter distribution (measured in a direction perpendicular to a centerline of fluid passages 24, 26) of between about 10 nm and 200 nm. In one implementation, metal islands 34, 36 have a density on/within substrate of 25% to 75% of substrate volume. In one implementation, metal etching islands 34, 36 comprise etching materials, such as gold particles, upon surface 42, which prior to etching, have a size/diameter of less than 50 µm with a spacing between adjacent islands from 10 nm to 2000 nm. In one implementation, metal etching island 34, 36, are formed in large groups upon surface 42, wherein such groups of islands 34, 36 are spaced from each other by between 20 µm and 50 µm. Such sizes and densities facilitate the formation of filtering passages 24, 26 for enhanced filtering properties. In other implementations, metal islands 34, 36 may have other sizes and densities.

In one implementation, filtering passages 24, 26 are formed utilizing different metal islands sizes, different metal island densities or different materials for metal islands 24, 26 such that the filtering characteristics of fluid passages 24, 26 and the size or interconnection of pores 38 differ between passages 24, 26. As a result, filter passages 24, 26 provide different filtering functions. In yet other implementations, filter passages 24, 26 are formed utilizing's identical or substantially similar metal islands sizes, metal island densities and/or materials such that the filtering characteristics of fluid passages 24, 26 in the size or interconnection of pores 38 are substantially the same.

In one implementation, the metal islands 34, 36 which become entrained within the porous filter passages 24, 26 may remain with filter 20. Such metal islands 34, 36 may function as signatures, identifying the supplier or source of filter 20, identifying the filtering properties of the different filter passages 24, 26 and/or identifying a batch number or manufacturing date for the particular filter 20. By subsequently analyzing the composition of the entrained metal etching islands 34, 36, the aforementioned signature may be read.

Figure 2:
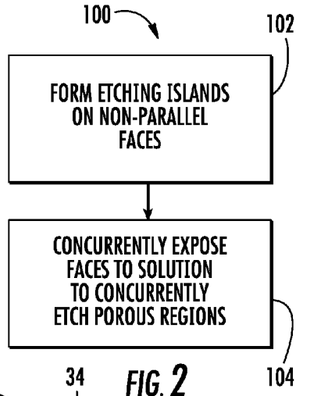
FIG. 2 is a flow diagram of an example method for forming the filter of FIG. 1.
Figure 3:
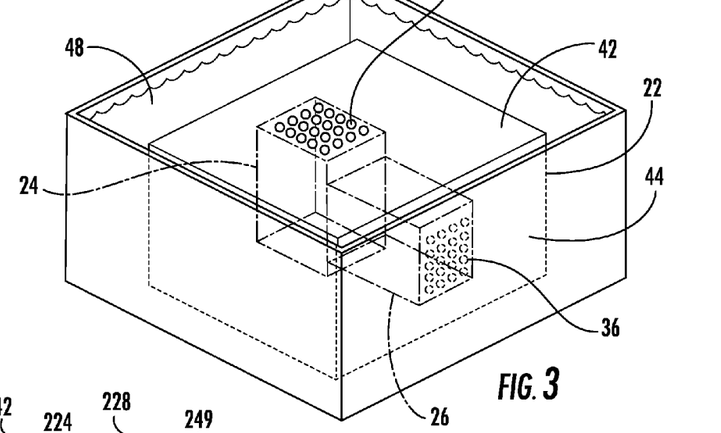
FIG. 3 is a perspective view illustrating the formation of the filter of FIG. 1 according to the method of FIG. 2.

FIG. 2 is a flow diagram illustrating an example method 100 for forming filter 20. FIG. 3 is a perspective view illustrating the formation of filter 20. As indicated by step 102 in FIG. 2 and shown in FIG. 3, metal etching islands 34, 36 which form etching islands are formed upon the exterior surface 42 of substrate 22. In the example illustrated, such etching islands 34, 36 are deposited in a pattern or upon selected portions of surfaces 42 and 44 of substrate 22 in locations so as to subsequently form the underlying filter passages 24, 26 (shown in broken lines). In one implementation, etching islands 34, 36 upon surface 42 have a size/diameter distribution (measured in a direction parallel to surface 42) of between about 10 nm and 200 nm. In one implementation, metal etching islands 34, 36 comprise etching materials, such as gold particles, upon surface 42, which prior to etching, have a size/diameter of less than 50 µm with a spacing between adjacent islands from 10 nm to 2000 nm. In one implementation, metal etching island 34, 36, are formed in large groups upon surface 42, wherein such groups of islands 34, 36 are spaced from each other by between 20 µm and 50 µm. Such sizes and densities facilitate the formation of filtering passages 24, 26 for enhanced filtering properties. In other implementations, metal islands 34, 36 may have other sizes and densities. As noted above, in one implementation, etching islands 34, 36 have properties such that etching islands 34, 36 react differently with a metal assisted etching solution to etch at different rates are to etch differently such that the southerly formed filter passages 24, 26 have different filtering properties.

In one implementation, etching islands 34, 36 are formed upon surface 42 by being sputtered at a power dosage a range of 100 to 200 W for a time range of a few seconds to five minutes. The temperature during such sputtering is in the range of ambient to 250° C. The pressure during sputtering is in the range of 1E-07 Torr to 1E2 Torr. In yet other implementations, the parameters for such sputtering may vary. In yet still other implementations, etching islands 34, 36 may be deposited or otherwise formed upon surface 42 utilizing other deposition techniques such as inkjet printing and the like. In some implementations, the patterning of etching islands 34, 36 upon surface 42 is achieved using masking.

As indicated by step 104 in FIG. 2 and further illustrated in FIG. 3, once metal islands 34, 36 have been formed or otherwise deposited upon surfaces 42, 44, etching islands 34, 36 are exposed to etching solution 48 to form filter passages 24, 26 of interconnected pores 38 (shown in FIG. 1). In the example illustrated, substrate 22 with metal islands 34, 36 deposited on the surfaces 42, 44, is lowered into a bath of etching solution 48 which initiates metal assisted chemical etching of pores 38 by etching islands 34, 36. In the example illustrated, solution 48 comprises hydrofluoric acid (HF) and hydrogen peroxide ($H_2O_2$) which reacts with etching islands 34, 36. In other implementations, solution 48 may comprise other fluids or liquids, such as hydrochloric acid (HCL) and hydrogen peroxide ($H_2O_2$), that facilitate a metal assisted etching. In other implementations, etching islands 34, 36 may be exposed to solution 48 in other fashions. Once etching islands 34, 36 has sufficiently etched into substrate 22, substrate 22 is removed from solution 48. In one implementation, substrate 22 is exposed to an etch stopping or inhibiting quench. For example, substrate 22 may be exposed to a quench of deionized water.

In one implementation, such etching is performing ambient temperature. In some implementations, the etching may occur with etching solution 48 at a temperature above ambient to increase or otherwise the impact the etch rate or etching characteristics. In one implementation, the etching of substrate 22 is performed under agitation. In another implementation, such etching may be performed in a still bath. The formulation of solution 48 may vary to provide a particular etch rate. For example, the ratio of hydrogen peroxide to hydrofluoric acid to water may depend upon a particular etch rate. This ratio may be adjusted during etching by islands 34, 36.

Figure 4:
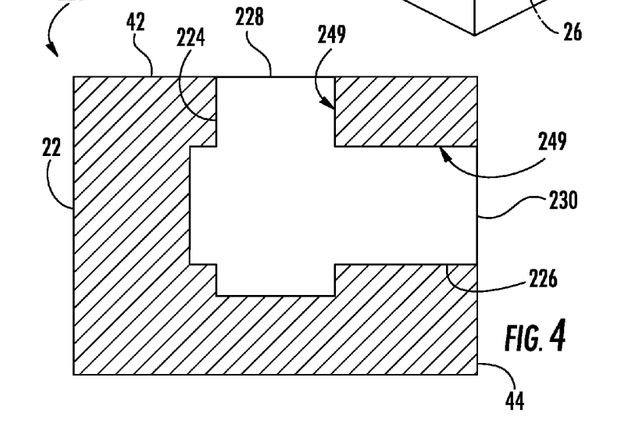
FIG. 4 is a sectional view of an example flow director.

FIG. 4 is a sectional view illustrating flow director 220. Flow director 220 is similar to filter 20 except that the internal pores 38 are removed, forming open flow paths 224, 226 in place of filter passages 24, 26, respectively. As with filter passages 24, 26, flow passages 224, 226 form a continuous flow path 249 having an inlet 228 in surface 42 of substrate 22 and an outlet 230 in surface 44 of substrate 22.

Flow director 220 is formed in a manner similar to the formation of filter 20 as described above with respect to method 100 shown in FIG. 2 except that the formation of flow director 220 includes an additional step of removing the internal porous material forming pores 38. In one implementation, substrate 22 is exposed to an etching solution which etches away substrate 22. Due to the porous nature of the material forming pores 38 within substrate 22, the material forming pores 38 preferentially etches or edges at a faster rate as compared to solid non-porous regions of substrate 22. As a result, flow passages 224, 226 and flow path 249 have substantially the same shape as the original porous passages formed by etching islands 34, 36. In other implementations, the material forming pores 38 is removed in other fashions.

Figures 5, 6, 7:
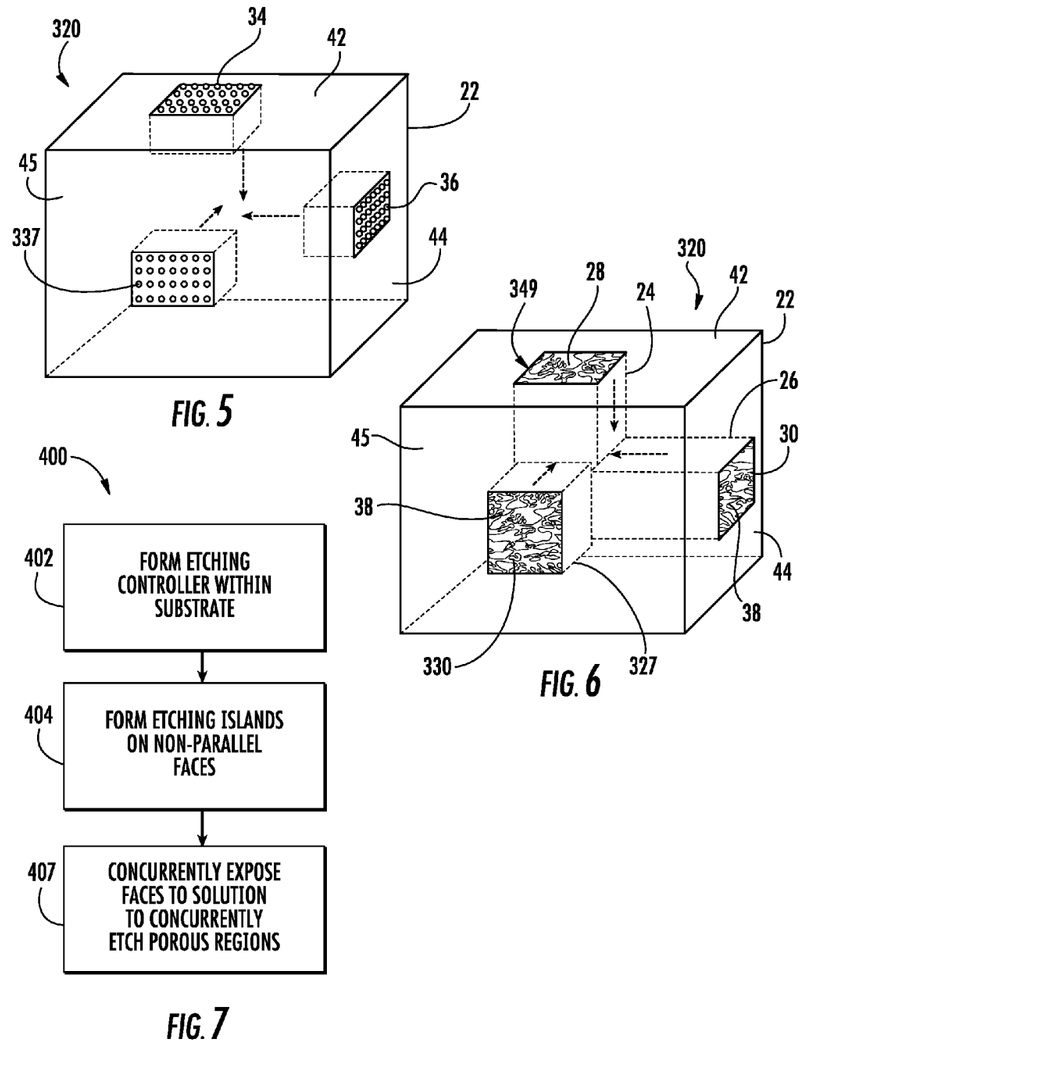
FIG. 5 is a perspective view of etching islands formed on non-parallel surfaces of a substrate to form the filter of FIG. 6.
FIG. 6 is a perspective view of another example filter.
FIG. 7 is a flow diagram of an example method for forming the filter of FIG. 9.

FIGS. 5 and 6 illustrate another example implementation of method 100 shown in FIG. 2. FIGS. 5 and 6 illustrate the formation of filter 320, another example implementation of filter 20. As shown by FIG. 6 which illustrates filter 320 in a complete state, filter 320 is similar to filter 20 except that filter 320 comprises filter passages 24, 26 (described above) and additionally comprises filter passage 327 and etching islands 337. Filter passages 24, 26 extend from surfaces 42 and 44 of substrate 22. Filter passage 327 extends from surface 45 of substrate 22 which is nonparallel to each of surfaces 42 and 44 and is nominally perpendicular to each of surfaces 42 and 44. Like filter passages 24, 26, filter passage 327 is composed of porous regions having interconnected pores 38 through which a fluid may flow while being filtered. Such pores of the past 327 are formed through etching of etching islands 337 (shown in FIG. 5). As with etching islands 34, 36 forming flow passages 24 and 26, respectively, etching islands 337 may remain entrained within the porous regions, serving as signatures for filter 320.

Filter passages 24, 26 and 327 form a composite or overall filter path 349 having an inlet 28 and a pair of outlets 30, 330. In another implementation, filter 320 may comprise a pair of inlets 30, 330 and a single output 28. Filter 320 facilitates the filtering of fluid using a greater percentage of the volume of substrate 22. Filter 320 facilitates filtering of a liquor or fluid in a first stage in filter passage 24 and partitioning the fluid flow into one of filter passages 26, 327, wherein the fluid may be differently filtered and may be directed to different receivers or consumers of the filtered fluid. In one implementation, the filtering properties of filter passages 24, 26 and 327 may be different as compared to one another due to different pore density, pore size and the like. In yet other implementations, the filtering properties of filter passages 24, 26 and 327 may have similar pore sizes or pore densities, but may have different filtering characteristics due to their different lengths within substrate 22.

FIG. 5 illustrates the patterning of etching islands 34, 36 and 337 upon surfaces 42, 44 and 45 of substrate 22 prior to substrate 22 be exposed to the etching solution 48 (as shown in FIG. 3) to initiate etching of the corresponding porous regions which form filter passages 24, 26 and 327. As shown by FIG. 5, etching islands 337 are deposited upon surface 45 which is non-parallel to, and nominally perpendicular to, each of surfaces 42 and 44. Like etching islands 34, 36, etching islands 337 react with etching solution 48 to etch into and through substrate 22. In one implementation, etching islands 337 comprise the same material as the material forming etching islands 34, 36. In other implementations, etching islands 337 are formed from different etching materials or different metals as compared to etching islands 34, 36. In one implementation, the composition, size and/or density of one or more of etching islands 34, etching islands 36 or etching islands 337 may differ with respect to one another such that filter passages 24, 26 and 327 have different lengths, different pore densities and/or different pore sizes so as to have different filtering properties.

As indicated by broken lines, when substrate 22 is subsequently exposed to etching solution 48, such as by being immersed in a bath of etching solution 48 (shown in FIG. 3), porous regions forming flow passages 24, 26 and 327 are concurrently formed or etched from each of the nonparallel sides, reducing fabrication time. In the example illustrated, the etching of such porous regions is allowed to continue until the porous regions of filter passages 24, 26 and 327 intersect within substrate 22 as shown in FIG. 6. At such point in time, substrate 22 may be immersed or otherwise exposed to an etch terminating liquid such as a bath of quenching deionized water.

In the example illustrated, filter passages 24, 26 and 327 are each blind, terminating at a closed end portions within substrate 22, wherein the closed end portions of substrate 22 form caps at the linear end of each of passages 24, 26. Although illustrated as extending past and across one another, in other implementations, filter passage 24, 26 and 327 may each terminate within or at an interior side of the other of filter passages 24, 26. In such implementations, because filter passages 24, 26, 327 terminate within substrate 22, rather than extending completely through substrate 22, substrate 22 offers greater structural integrity and stability about the overall filtering passage 349. In yet other implementations, one or more of filter passages 24, 26, 327 may alternatively extend completely through substrate 22. In some implementations, the open ends of such filter passages 24, 26, 327 may be sealed, capped or otherwise occluded, directing all fluid flow entering input 28 through outlets 30, 330.

In particular implementations, the porous regions forming filter passages 24, 26 and 327 may be subsequently removed through etching or other material removal processes to form open flow passages similar to the open flow passages shown in FIG. 4. In some implementations, instead of forming open flow passages through substrate 22, the formation of porous regions from multiple nonparallel surfaces or faces of substrate 22 and the subsequent removal of such porous regions through preferential etching may be utilized to form three-dimensional structures having three-dimensional shapes such as three-dimensional shapes that vary along each orthogonal face. For example, the porous regions formed by etching islands 34, 36 and 337 may extend along outer surfaces of substrate 22 forming outer channels and shapes along the outer surface of substrate 22. Removal of the outer porous regions reshapes the outer profile of substrate 22 to form the three-dimensional structure.

Figure 8:
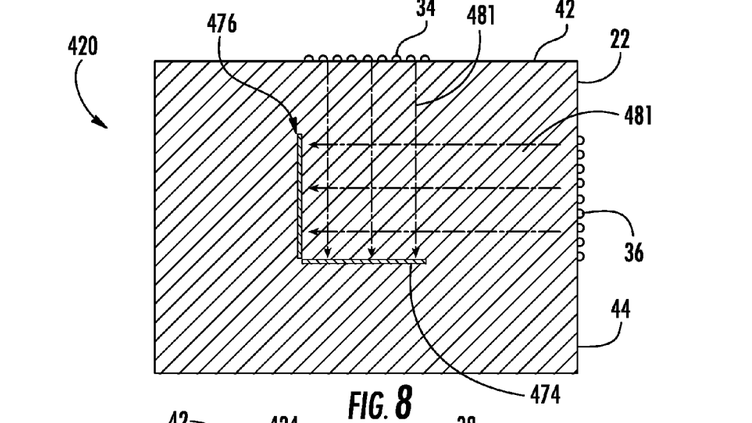
FIG. 8 is a sectional view of a substrate illustrating the forming of etching controllers within the substrate and etching islands on non-parallel faces of the substrate.
Figure 9:
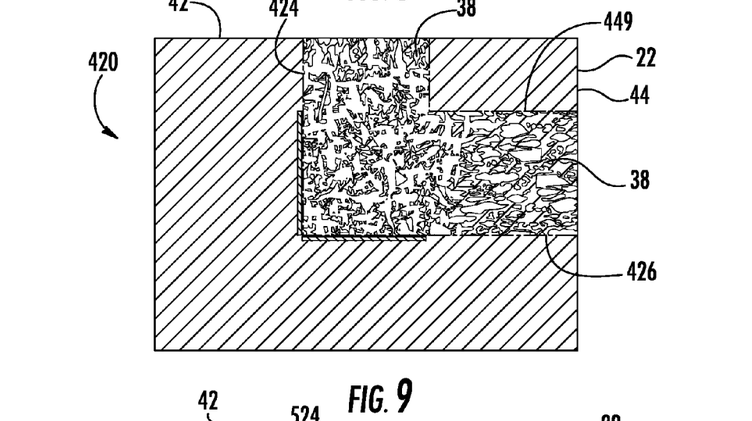
FIG. 9 is a sectional view of an example filter formed according to the method of FIG. 7.

FIG. 7 is a flow diagram illustrating an example method 400 for forming filter 420 shown in a completed state in FIG. 9. As indicated by step 402, etching retarding layers or controllers 474, 476 are initially formed within substrate 22. FIG. 8 is a sectional view illustrating the formation of etching controllers 474, 476 within substrate 20. Etch controllers 474, 476 comprise layers of material that impede, resist or hinder etching by etching islands 34, 36. Etch controller 474 is formed within substrate 22 opposite to and facing etching islands 34 or on the portion of surface 42 upon which etching islands 34 are to be located. Etch controller 476 is formed within substrate 22 opposite to and facing etching islands 36 or on the portion of surface 44 upon which etching islands 36 are to be located. As a result, etch controller 474 limits and controls the depth or length of the portion of filter passage 24 etched by etching islands 34 Likewise, etch controller 474 limits and controls the depth or length of the portion of filtering passage 26 etched by etching islands 36. In such a manner, etch controllers 474, 476 control the location of the intersection of filter passages 424, 426, respectively, to form filter path 449.

In the example illustrated, etch controllers 474, 476 each comprises layers of etch retarding material such as buried oxide. In one implementation, etch controllers 474, 476 comprise layers formed or patterned by doping of substrate 22 (schematically represented by arrows 481 in FIG. 8). In other implementations, etch controllers 474, 476 may be formed from other materials and may be formed or located in other fashions. In other implementations, fewer are additional etch controllers may be formed within substrate 22 to control etching of substrate 22.

As indicated by step 404 of FIG. 7, etching islands 34, 36 are formed upon the nonparallel faces 42, 44 of substrate 22 as illustrated by FIG. 8. As indicated by step 406 in FIG. 7, surfaces 42, 44 and etching islands 34, 36 are concurrently exposed to etching solution 48 (shown in FIG. 3) to concurrently etch the porous regions of filter passages 424, 426 (shown in FIG. 9). Steps 404, 407 be carried out similar to as described above with respect to steps 102, 104, respectively.

Figure 10:
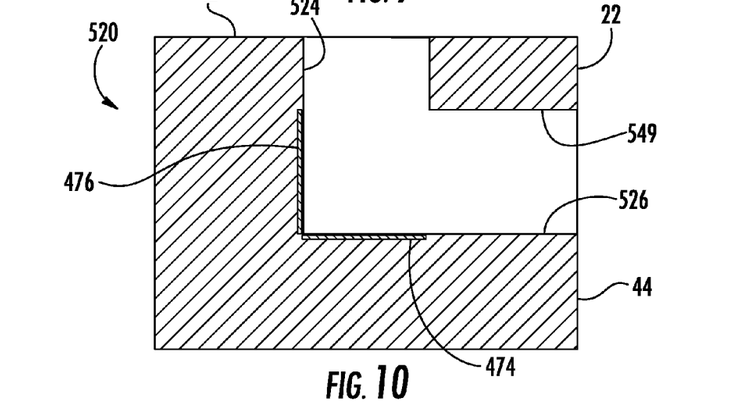
FIG. 10 is a sectional view of an example flow director.

FIG. 10 is a sectional view of flow director 520. Flow director 520 is similar to filter 420 except that the internal pores 38 are removed, forming open flow paths 524, 526 in place of filter passages 424, 426, respectively. As with filter passages 424, 426, flow passages 524, 526 form a continuous flow path 549 having an inlet 528 in surface 42 of substrate 22 and an outlet 530 in surface 44 of substrate 22.

Flow director 520 is formed in a manner similar to the formation of filter 420 as described above with respect to method 400 shown in FIG. 7 except that the formation of flow director 520 includes an additional step of removing the internal porous material forming pores 38 and filter passages 424, 426. In one implementation, substrate 22 is exposed to an etching solution which etches away silicon 22. Due to the porous nature of the material forming pores 38 within substrate 22, the material forming pores 38 preferentially etches or etches at a faster rate as compared to solid non-porous regions of substrate 22. As a result, flow passages 524, 226 and flow path 549 have substantially the same shape as the original porous passages formed by etching islands 34, 36. In other implementations, the material forming pores 38 is removed in other fashions.

Figure 11:
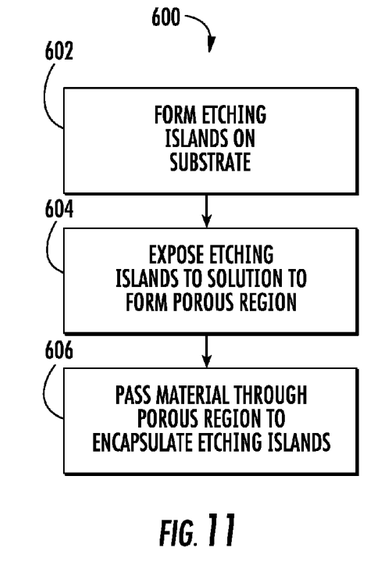
FIG. 11 is a flow diagram of an example method for encapsulating etching islands in a body.
Figure 12:
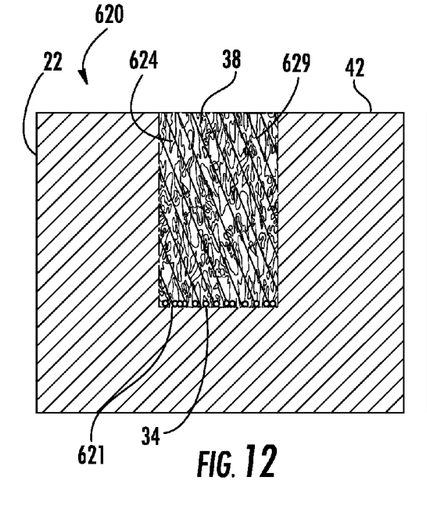
FIG. 12 is a sectional view of an example body having encapsulated etching islands according to the method of FIG. 11.
Figure 13:
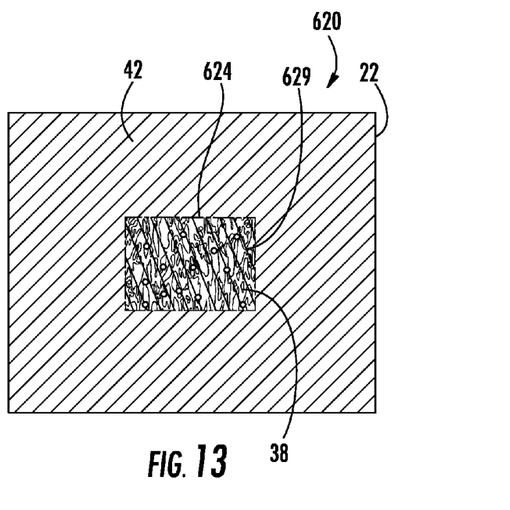
FIG. 13 is a top plan view of the body of FIG. 12.

FIG. 11 is a flow diagram of method 600, an example implementation of method 100 shown in FIG. 2. Method 600 facilitates the formation of buried or encapsulated metallic or conductive regions within a substrate. FIGS. 12 and 13 are sectional views illustrating an example body 620 having a buried metallic or conductive layer 621. As indicated by step 602 and FIG. 11, etching islands 34 (described above) are initially formed or deposited upon surface 42 of substrate 22.

As indicated by step 604, the etching islands 34 upon surface 42 are exposed to etching solution 48 (shown in FIG. 3) such as by immersing substrate 22 in a bath of etching solution 48. Etching islands 34 interact with the etching solution 48 to etch into surface 42 and into substrate 22 to form a porous region 624 having pores 38. In one implementation, the depth in which etching islands 34 etch into or sink into substrate 22 is controlled by controlling the duration in which substrate 22 is exposed to etching solution 48, wherein etching is terminated by exposing substrate 22 to an etching stop such as a deionized water quench. In other implementations, the depth in which etching islands 34 etch into or sink into substrate 22 is controlled using a buried etch retarding layer or etch controller as described above with respect to etch controller 474, 476.

As indicated by step 606, an encapsulating material 629 (schematically represented by crosshatching) is passed through the interconnected pores 38 of porous region 624 to encapsulate the etching islands 34. In one implementation, the encapsulating material 629 comprises a dielectric material, such as a polymer. In another implementation, the encapsulating material 629 may comprise an electrically conductive material for being electrically coupled to etching islands 34. In one implementation, the encapsulating material has a viscosity so as to flow through pores 38 to cover and encapsulate etching islands 34. In one implementation, the encapsulating material fills the pores 38 of porous region 624. The encapsulated etching islands 34, formed from a metal in one implementation, remain encapsulated or buried within substrate 22, providing a signature for identifying substrate 22 and body 620 or for serving as an internal electrically conductive structure. The internal electric conductive constructor provided by the encapsulated etching islands 34 may be subsequently exposed through etching or other material removal techniques applied to substrate 22.

Figure 14:
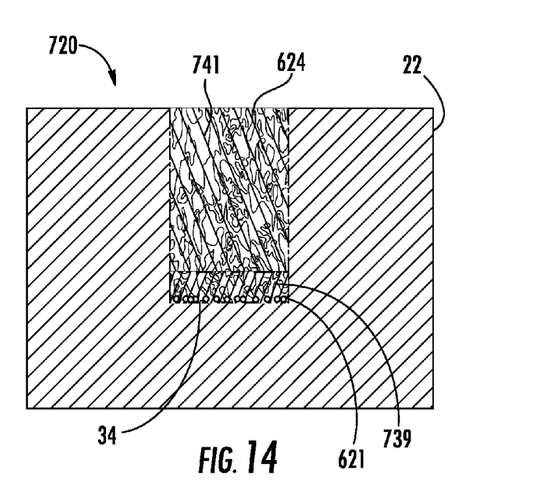
FIG. 14 is a sectional view of another example body formed according to the method of FIG. 11.

FIG. 14 is a sectional view illustrating body 720, another example implementation of body 620 in which the metal etching islands 34 are encapsulated within substrate 22. Body 720 is similar to body 620 and is formed in a similar fashion as body 620 according to method 600 except that after two encapsulating layers of material are passed through porous region 624 to encapsulate etching islands 34. After etching islands 34 have etched into substrate 22 and have formed porous region 624, a first encapsulating material 739 (schematically represented by crosshatching 739) is passed through porous region 624 to cover and encapsulate etching islands 34 while filling 438 of porous region 64 which extend adjacent to encapsulating islands 34. Thereafter, a second encapsulating material 741 (schematically represented by crosshatching 741) is passed through porous region 624 to fill pores 38 above encapsulating material 739. In one implementation, encapsulating material 739 comprises an electrically conductive material, such as electrically conductive metal, wherein encapsulating material 741 comprises a dielectric material to selectively insulate the buried electric conductive regions formed by encapsulating islands 34 and encapsulating material 739.

Although the present disclosure has been described with reference to example embodiments, workers skilled in the art will recognize that changes may be made in form and detail without departing from the spirit and scope of the claimed subject matter. For example, although different example embodiments may have been described as including one or more features providing one or more benefits, it is contemplated that the described features may be interchanged with one another or alternatively be combined with one another in the described example embodiments or in other alternative embodiments. Because the technology of the present disclosure is relatively complex, not all changes in the technology are foreseeable. The present disclosure described with reference to the example embodiments and set forth in the following claims is manifestly intended to be as broad as possible. For example, unless specifically otherwise noted, the claims reciting a single particular element also encompass a plurality of such particular elements.

What is claimed is:

1. A method comprising:
   forming etching islands on a first face of a substrate and on a second face of the substrate nonparallel to the first face;
   concurrently exposing the first face and the second face of the substrate to a solution that reacts with the etching islands to concurrently form porous regions extending into the first face and the second face, the porous regions comprise interconnected pores; and
   interconnecting the porous region extending into the first face and the porous region extending into the second face to form a filter passage through the substrate.

2. The method of claim 1, further comprising:
   forming etching islands on a third face nonparallel to the first face and nonparallel to the second face; and
   concurrently exposing the first face, the second face and the third face of the substrate to the solution that reacts with the etching islands to concurrently form porous regions extending into the first face, the second face and the third face.

3. The method of claim 1, further comprising removing the porous regions.

4. The method of claim 1, wherein the etching islands formed on the first face have a first etching rate when exposed to the solution and wherein the etching islands formed on the second face have a second etching rate different than the first etching rate when exposed to the solution.

5. The method of claim 4, wherein the etching islands formed on the first face have properties different than that of the etching islands formed on the second face so as to react differently with a solution when forming the porous regions.

6. The method of claim 1, further comprising forming an etch controller within selected portions of the substrate, the etch controller adjusting an etch rate of the etch islands such that the etch islands have a first etch rate when interacting with unselected portions of the substrate and a second etch rate, different than the first etch rate, when interacting with the selected portions of the substrate.

7. The method of claim 6, wherein the etch controller comprises an etch retardant.

8. The method of claim 6, wherein forming the etch controller within the substrate comprises doping of the substrate.

9. The method of claim 6, wherein the etch controller is embedded within the substrate, being spaced from an exterior of the substrate.

10. The method of claim 9, wherein the etch controller extends parallel to the first face, spaced from the first face and opposite the etching islands formed on the first face.

11. The method of claim 10, further comprising forming a second etch controller within second selected portions of the substrate, wherein the second etch controller extends parallel to the first second, spaced from the second face and opposite the etching islands formed on the second face.

12. The method of claim 11, wherein the etch controller and the second etch controller each comprise etch retardants and wherein the etch controller and the second etch controller extend adjacent one another within the substrate.

13. The method of claim 1, comprising submersing the substrate within the solution.

14. The method of claim 1, wherein the substrate comprises a polygonal block of material having the first face and the second face.

15. The method of claim 1, wherein the second face is perpendicular to the first face.

16. The method of claim 1, wherein the porous region extending in the first face is perpendicular to the porous region extending into the second face.

17. The method of claim 1, wherein the porous region extending into the first face terminates prior to reaching a third face of the substrate opposite the first face.

18. The method of claim 17, wherein the porous region extending into the second face terminates prior to reaching a fourth face of the substrate opposite the second face.

* * * * *